United States Patent [19]
Obata et al.

[11] Patent Number: 5,665,497
[45] Date of Patent: Sep. 9, 1997

[54] IMAGE RECORDING METHOD

[75] Inventors: Hiroyuki Obata; Kohji Ichimura, both of Tokyo, Japan

[73] Assignee: Dai Nippon Printing Co., Ltd., Tokyo, Japan

[21] Appl. No.: 556,011

[22] Filed: Nov. 9, 1995

Related U.S. Application Data

[62] Division of Ser. No. 9,402, Jan. 27, 1993, abandoned, which is a continuation of Ser. No. 613,712, filed as PCT/JP90/00338, Mar. 15, 1990, abandoned.

[30] Foreign Application Priority Data

| Mar. 16, 1989 | [JP] | Japan | 64262 |
| Mar. 17, 1989 | [JP] | Japan | 65462 |
| Mar. 17, 1989 | [JP] | Japan | 65463 |
| Mar. 16, 1990 | [JP] | Japan | 64261 |

[51] Int. Cl.⁶ .......................... G03G 17/04; G03G 13/04
[52] U.S. Cl. ............................... 430/35; 430/32; 430/48
[58] Field of Search ............................ 430/31, 48, 35, 430/32; 355/217, 215

[56] References Cited

U.S. PATENT DOCUMENTS

| 2,833,648 | 5/1958 | Walkup | 96/1 |
| 3,653,890 | 4/1972 | Seimiya et al. | 96/1 R |
| 3,653,891 | 4/1972 | Thourson et al. | 96/1 |
| 4,207,100 | 6/1980 | Kadokura et al. | 430/48 |

OTHER PUBLICATIONS

R.M. Schaffert, Electrophotography: John Wiley, NY, 1975, pp. 512–533, 542–547.

*Primary Examiner*—Susan W. Berman
*Attorney, Agent, or Firm*—Armstrong, Westerman, Hattori, McLeland & Naughton

[57] ABSTRACT

Electric discharge between a photosensitive member and a charge retaining medium is ON/OFF controlled by changing the gas pressure between these two members, so that it is possible to effect image recording in a state where a DC voltage is applied. Accordingly, it is possible to effect image recording on the charge retaining medium without the need for precise control for obtaining a high-voltage pulse and without employing an optical shutter. In addition, an electric charge that is emitted by a field is attracted to the charge retaining medium and accumulated on the surface thereof, thereby forming an electrostatic latent image, and thus making it possible to attain image recording of extremely high resolution.

2 Claims, 11 Drawing Sheets

Irradiation light

Generated electric charge

FIG. 19(a)     FIG. 19(b)     FIG. 19(c)
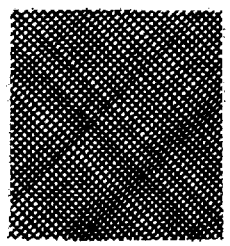
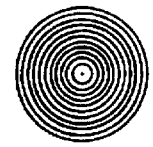
FIG. 20
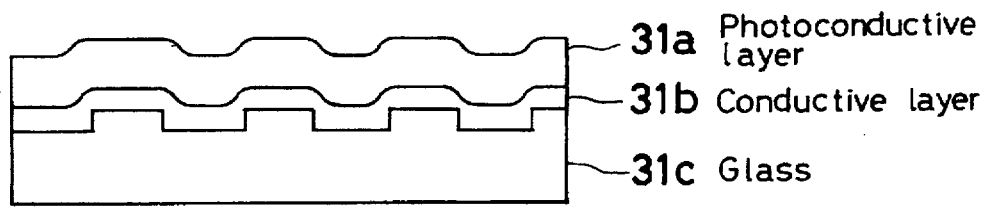
FIG. 21
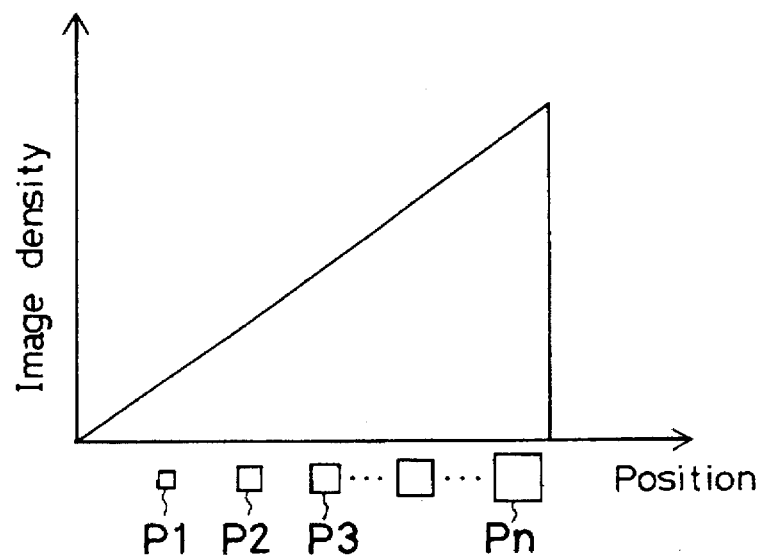

IMAGE RECORDING METHOD

This is a divisional of application Ser. No. 08/909,402 filed Jan. 27, 1993, now abandoned which was a continuation of application Ser. No. 613,712, filed as PCT/JP90/00338, Mar. 15, 1990 now abandoned.

BACKGROUND OF THE INVENTION

1. Field of the Invention

The present invention relates to an image recording method which is designed so that an electrostatic latent image of high resolution is formed on an insulating layer by utilizing an electric discharge, field emission, etc.

2. Description of the Related Art

Japanese Patent Application No. 63-121592 discloses a method wherein a photosensitive member consisting of a conductive layer and a photoconductive layer, which are successively formed on a substrate in the mentioned order, is disposed in close proximity and in opposing relation to a charge retaining medium consisting of a conductive layer and an insulating layer, which are successively formed on a substrate in the mentioned order, and exposure is carried out with a voltage being applied between the two conductive layers, thereby inducing a corona discharge between the photosensitive member and the charge retaining medium, and thus recording an image on the charge retaining medium and also effecting reproduction. According to this method, it is possible to effect analog recording of extremely high resolution and also possible to maintain the electrostatic latent image on the charge retaining medium semipermanently.

In such image recording, a high-voltage pulse is applied between the respective electrodes of the photosensitive member and the charge retaining medium to record an image without using an optical shutter. Alternatively, with a DC voltage being applied between the two electrodes, an image is recorded using an optical shutter.

However, the method wherein a high-voltage pulse is applied without using an optical shutter suffers from the problem that the rise and fall of the pulse are likely to become less sharp, and if precise control is effected so as to make the rise and fall of the pulse sharp, the cost of the system becomes extremely high. The method that uses an optical shutter to effect image recording involves the problem that the number of parts increases, which similarly results in a rise in the cost.

Although the above-described image recording method is extremely superior in that it provides high resolution and enables semipermanent recording, the prior art suffers from the following problems: In a corona discharge, charged particles that are accelerated by an electric field collide with other molecules one after another, causing ionization in an avalanche manner, and as a result, an electric discharging state is attained. For this reason, the collision between particles is essential for attaining and maintaining a discharging state. As the result of the collision between charged particles, the direction of motion of the particles is not always coincident with the direction of the electric field from the microscopic viewpoint, and the particles are therefore adsorbed on the charge retaining medium with a certain degree of spread, thus causing the resolution to be deteriorated.

Generally speaking, when a continuous tone image is to be expressed, in some cases it is difficult to obtain the desired output unless recording is effected using halftone dots. Devices that are commonly employed as hard copy devices, for example, ink-jet printers, thermal transfer printers, etc., are only capable of binary expression, that is, black-and-white expression, and these devices necessitate formation of halftone dots when a photographic tone image is desired to output.

In the dot forming process, the size of dots are changed in accordance with the image density without changing the pitch, thereby expressing a continuous tone.

However, an overwhelming majority of printers which are used as hard copy devices are only capable of black-and-white expression, and it is necessary in order to output a photographic tone image to carry out dot forming process, as described above. In domestic or amateur use, however, dot forming process must be executed using a personal computer or a built-in CPU, which is incorporated in a hard copy device. For a computer, the load of forming dots is extremely heavy in terms of both hardware and software, which results in a rise in the cost. In the field of printing, formation of dots is performed in order to obtain a precise image and this needs a signal processing for dot formation in a color scanner, so that the load on the system is extremely heavy and the cost is increased considerably.

The above-described image recording method further involves the problem that, if the voltage across the gap between the photosensitive member and the charge retaining medium exceeds a voltage at which Paschen discharge is initiated, a predetermined potential is undesirably generated on the charge retaining medium even in a case where no exposure is carried out, and this potential constitutes a background, which results in a lowering in the contrast.

It is an object of the present invention to provide an image recording method which enables a high-voltage pulse to be obtained without the need for precise control and which has no need to employ an optical shutter.

It is another object of the present invention to provide an image recording method which is designed so that the resolution is improved.

It is still another object of the present invention to provide an image recording method which reduces the load of dot formation and enables a continuous tone image to be readily recorded.

It is a further object of the present invention to provide an image recording method wherein an electric charge which is opposite in polarity to an image forming charge is formed in advance of the image exposure, thereby effecting precharging, and thus enabling the contrast to be improved.

SUMMARY OF THE INVENTION

To these ends, the present invention provides an image recording method in which a photosensitive member consisting of a photoconductive layer which is formed on a substrate with a conductive layer interposed therebetween is disposed face-to-face with a charge retaining medium consisting of an insulating layer which is formed on a substrate with a conductive layer interposed therebetween, and image exposure is carried out with a voltage being applied between the two conductive layers, thereby inducing an electric discharge in the gap between the photosensitive member and the charge retaining medium, and thus storing an electric charge in the form of an image on the surface of the charge retaining medium, wherein the electric discharge is ON/OFF switched by changing either the gap length or the gas pressure between the photosensitive member and the charge retaining medium, thereby effecting image recording.

By virtue of the above-described arrangement, it is possible to ON/OFF switch the electric discharge between the photosensitive member and the charge retaining medium and hence effect image recording in a state where a DC voltage is being applied. Accordingly, it is possible to effect image recording on the charge retaining medium without the need for precise control for obtaining a high-voltage pulse and without employing an optical shutter.

The present invention is also characterized in that either the gap length or the gas pressure between the photosensitive member and the charge retaining medium is set so that a field emission occurs, at least one surface of these two members being provided with dimple patterns, to effect contact image exposure, thereby enabling a predetermined minute gap to be obtained.

By virtue of the above-described arrangement, the probability of charged particles colliding with molecules is extremely low because the gap is extremely small or the gas pressure is low, so that charges are accelerated in the direction of the electric field without being spread by collision and it is therefore possible to attain image recording of extremely high resolution.

In the present invention, further, the conductive layer and/or surface of at least either the photosensitive member or the charge retaining medium is provided with dimple patterns, thereby dimply changing the voltage that is applied across the gap between them and modulating the discharge pattern in accordance with the dimple patterns, and thus enabling a halftone dot image to be recorded simultaneously with the exposure. It is therefore unnecessary to effect a special electrical processing for the formation of halftone dots and hence possible to record a halftone dot image at a reduced cost and with ease.

In the present invention, further, an electric charge which is opposite in polarity to an image forming charge is uniformly formed on the charge retaining medium in advance of the image exposure, and thereafter exposure is carried out under the application of a voltage with the normal polarity, thereby reducing the background potential at the unexposed region and also increasing the potential at the photosensitive member. As a result, it is possible to raise the contrast potential and improve the sensitivity.

BRIEF DESCRIPTION OF THE DRAWINGS

FIG. 19 shows examples of screen images by dimple patterns;

FIG. 20 shows a dimple pattern forming method;

FIG. 21 is a view which is employed to explain a halftone dot image;

DETAILED DESCRIPTION OF THE PREFERRED EMBODIMENTS

Figure 1A:
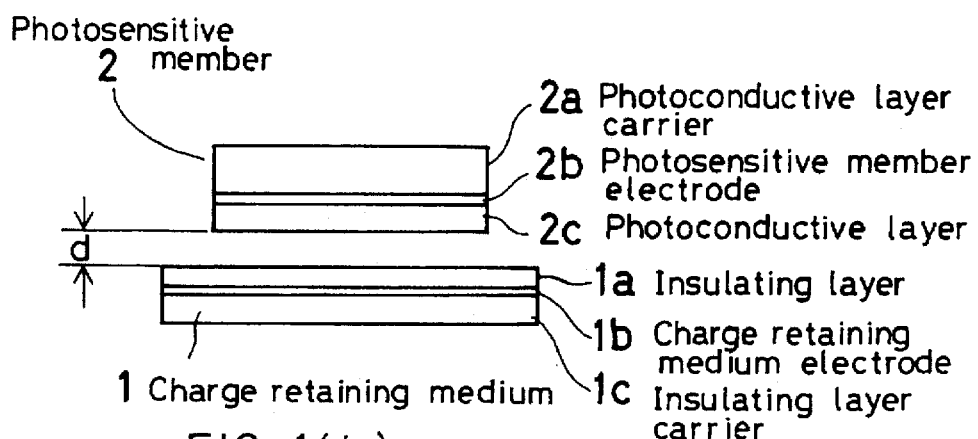
FIG. 1 shows the image recording method according to the present invention.

FIG. 1 is a view which is employed to explain the principle of the image recording method according to the present invention, in which reference numeral 1 denotes a charge retaining medium, 1a an insulating layer, 1b a charge retaining medium electrode, 1c an insulating layer substrate, 2 a photosensitive member, 2a a photoconductive layer substrate, 2b a photosensitive member electrode, 2c a photoconductive layer, and E a power source.

In the arrangement shown in FIG. 1, exposure is effected from the side of the arrangement which is closer to the photosensitive member 2. As shown in FIG. 1(a), the photosensitive member 2 is formed by forming the photosensitive member electrode 2b of 1000 Å thick, which is transparent and made of ITO, on the photoconductive layer substrate 2a of 1 mm thick, which is made of glass, and further forming the photoconductive layer 2c of about 10 μm on the electrode 2b. The charge retaining medium 1 is disposed in opposing relation to the photosensitive member 2 across an air gap of about 10 μm. The charge retaining medium 1 is formed by forming by evaporation the Al electrode 1b of 1000 Å thick on the insulating layer substrate 1c of 1 mm thick, which is made of glass, and further forming the insulating layer 1a of 10 μm thick on the electrode 1b.

Figure 1B:
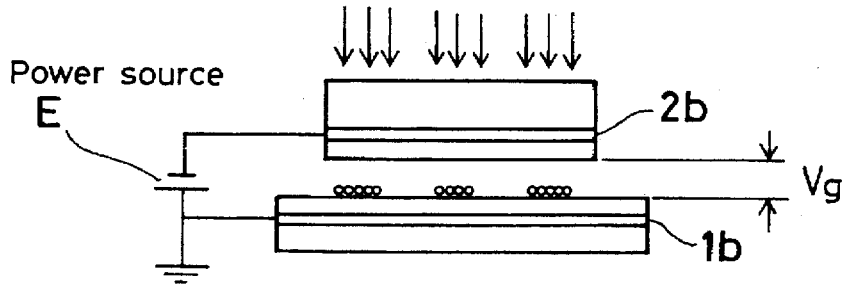

In this arrangement, a voltage is applied between the electrodes 2b and 1b from the power source E, as shown in FIG. 1(b). If this arrangement is placed in a dark place, since the photoconductive layer 2c is a highly resistive element, no change occurs between the electrodes, or an electric discharge occurs at the air gap when a voltage which exceeds the Paschen discharge initiating voltage is applied across the air gap due to the magnitude of the applied voltage or the leakage current from the substrate electrode, resulting in an electrostatic charge corresponding to the dark current being formed on the charge retaining medium. If light is applied from the photosensitive member side, photocarriers (electrons or holes) are generated in the photoconductive layer 2c at a region where the light is incident, so that an electric charge which is opposite in polarity to the charge retaining medium electrode moves therethrough toward the surface. During this process, when the voltage distribution to the air gap exceeds the Paschen discharge initiating voltage, a corona discharge occurs between the photoconductive layer 2c and the insulating layer 1a, or the electric charge is drawn out from the photoconductive layer 2c by the field emission and then accelerated by the electric field. In this way, an electric charge is stored on the insulating layer 1a.

Figure 2:
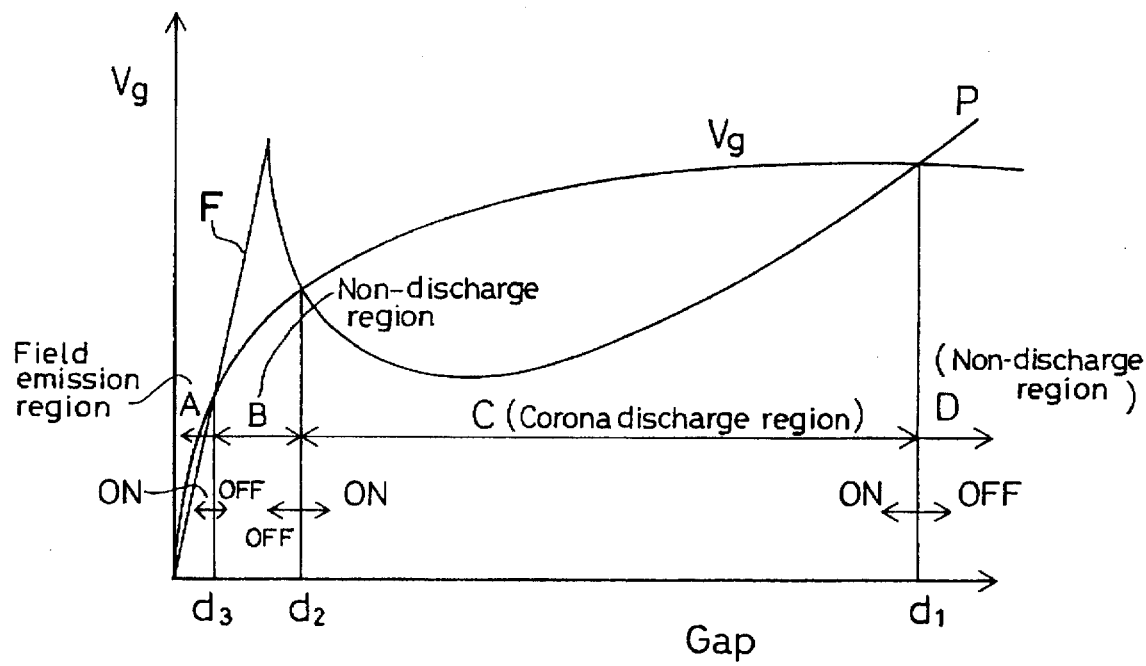
FIG. 2 is a graph showing the relationship between the gap and the electric discharge.

FIG. 2 is a graph showing the relationship between the gap length and the gap voltage.

The voltage $V_g$ (see FIG. 1(b)) across the gap between the opposing surfaces of the photosensitive member and the charge retaining medium is represented by a quadratic curve which approaches the supply voltage E as the gap d increases, as shown in FIG. 2. P denotes a Paschen discharge curve which shows corona discharge characteristics. The Paschen discharge initiating voltage reaches a minimum at a certain gap, and as the gap becomes greater than this, the electric field decreases and hence the Paschen discharge initiating voltage rises. In addition, as the gap narrows, the probability of particles colliding with each other decreases and it becomes difficult for the corona discharge to occur. Therefore, the discharge initiating voltage rises. If the gap further narrows to, for example, about 2 μm or less, in the atmospheric pressure, no Paschen discharge occurs any longer, and a field emission occurs instead, as shown by the straight line F. Accordingly, in a region where the gap voltage $V_g$ is greater than the straight line F or the curve P, an electric discharge occurs, whereas, in a region where the gap voltage $V_g$ is smaller than the straight line F or the curve P, no electric discharge occurs. More specifically, the region A in the figure is a field emission region, the region B a non-discharge region, the region C a corona discharge region, and the region D a non-discharge region. Thus, it is possible to ON/OFF switch the corona discharge by changing the gap d (shown in FIG. 1(a)) between the photosensitive member and the charge retaining medium with $d_1$ or $d_2$ shown in FIG. 2 being used as a boundary, and it is also possible to ON/OFF switch the field emission by changing the gap d between the photosensitive member and the charge retaining medium with $d_3$ shown in FIG. 2 being used as a boundary.

Accordingly, a corona discharge is induced by changing the gap d between the photosensitive member and the charge retaining medium, for example, from a value which is greater than $d_1$ shown in FIG. 2 to a value which is smaller than $d_1$, and the corona discharge is suspended by increasing the gap d to a value which is greater than $d_1$, thereby enabling image recording. It is also possible to effect image recording in such a manner that a corona discharge is induced by changing the gap d from a value which is smaller than $d_2$ to a value which is greater than the same, and it is suspended by reducing the gap d to a value which is smaller than $d_2$.

Thus, a shutter operation can be performed by changing the gap d between the photosensitive member and the charge retaining medium, and it is possible to effect image recording by utilizing this operation.

In a case where a field emission is utilized, the gap d is set at a value which is greater than $d_3$ in advance, and when image recording is to be effected, the gap d is temporarily made smaller than $d_3$ to induce a field emission and then made greater than $d_3$ to suspend the field emission, thereby enabling image recording to be effected.

Figure 1C:
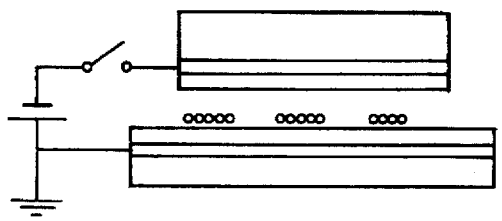
Figure 1D:
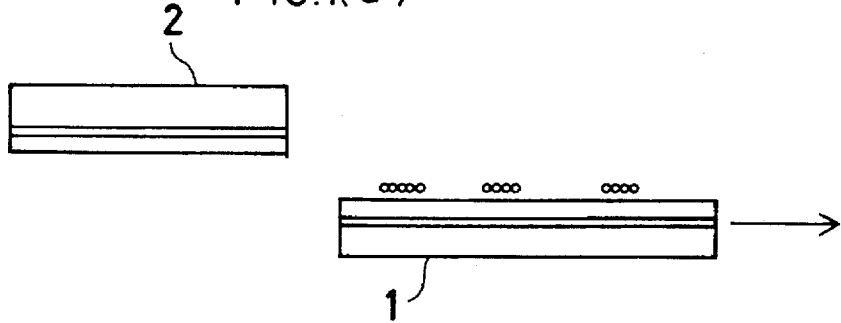

After the exposure has been completed in this way, the voltage supply is cut off, as shown in FIG. 1(c), and then the charge retaining medium 1 is taken out, as shown in FIG. 1(d), thus completing the formation of an electrostatic latent image.

When planar analog recording is effected by this recording method, a high resolution is obtained in the same way as in the case of conventional photography. Although the electric surface charge that is formed on the insulating layer 1a is exposed to the atmospheric environment, since air has an excellent insulating performance, it can be retained for a long period of time without being discharged regardless of whether the medium is placed in a light place or dark place.

The retaining period of the electric charge on the insulating layer 1a is determined by the properties of the insulator used and therefore depends on the charge capturing properties of the insulator in addition to the insulating properties of the air. Although in the foregoing description the electric charge is explained as electric surface charge, it should be noted that the stored charge can be retained for a long period of time because the injected charge may be stored simply on the surface and, microscopically, it may be also injected into the insulating layer near the surface thereof, resulting in electrons, holes or ions being trapped in the structure of the substance that constitutes the layer. In addition, the surface of the insulating layer 1a may be covered with an insulative film or the like in order to prevent physical damage to the charge retaining medium or the occurrence of electric discharge when the humidity is high.

Figure 3:
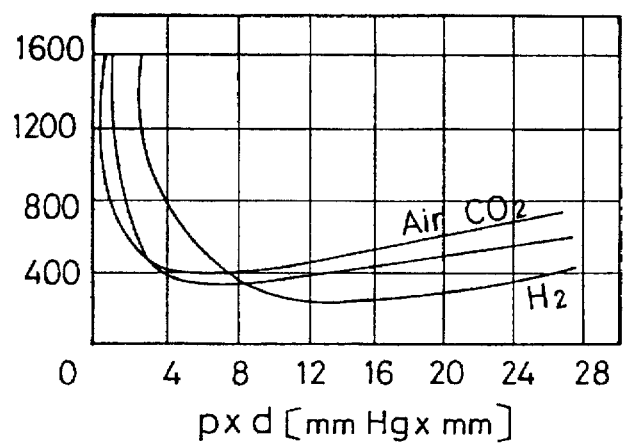
FIG. 3 is a graph showing Paschen discharge characteristics.

FIG. 3 is a graph showing the Paschen discharge curve, in which the axis of abscissas represents the product of the pressure and the distance between the two electrodes and the axis of ordinates represents the discharge initiating voltage. As will be understood from this graph, the corona discharge depends on the product of the pressure and the discharge gap, and even when the pressure is lowered, the discharge initiating voltage rises. This is because, as the pressure is lowered, the density of molecules decreases and hence the probability of collision decreases. Accordingly, if the pressure is sufficiently lowered, no corona discharge occurs any longer. Thus, the region shifts from the corona discharge region to the field emission region.

It will be understood from this fact that it is also possible to ON/OFF switch the electric discharge by changing the gas pressure in the area between the photosensitive member and the charge retaining medium and hence possible to realize a shutter function by utilizing a change in the gas pressure. Since it is also possible to change $d_1$, $d_2$ and $d_3$ shown in FIG. 2 by changing the gas pressure, it is possible to set $d_1$, $d_2$ and $d_3$ with which the ON/OFF switch can be readily effected by properly selecting a level of gas pressure.

FIG. 3 also reveals that the Paschen discharge characteristics also vary with the kind of gas which is present in the gap. It is therefore possible to set $d_1$, $d_2$ and $d_3$ with which the ON/OFF switch can be readily effected by filling the discharge gap with a predetermined gas, for example, an inert gas.

Thus, the method that is disclosed in FIG. 2 enables a shutter function to be realized with a DC voltage being applied so as to effect image recording by changing either the gap or the gas pressure between the photosensitive member and the charge retaining medium and hence has no need to employ precise control for generating a high-voltage pulse nor an optical shutter. It is therefore possible to reduced the system cost.

Figure 4:
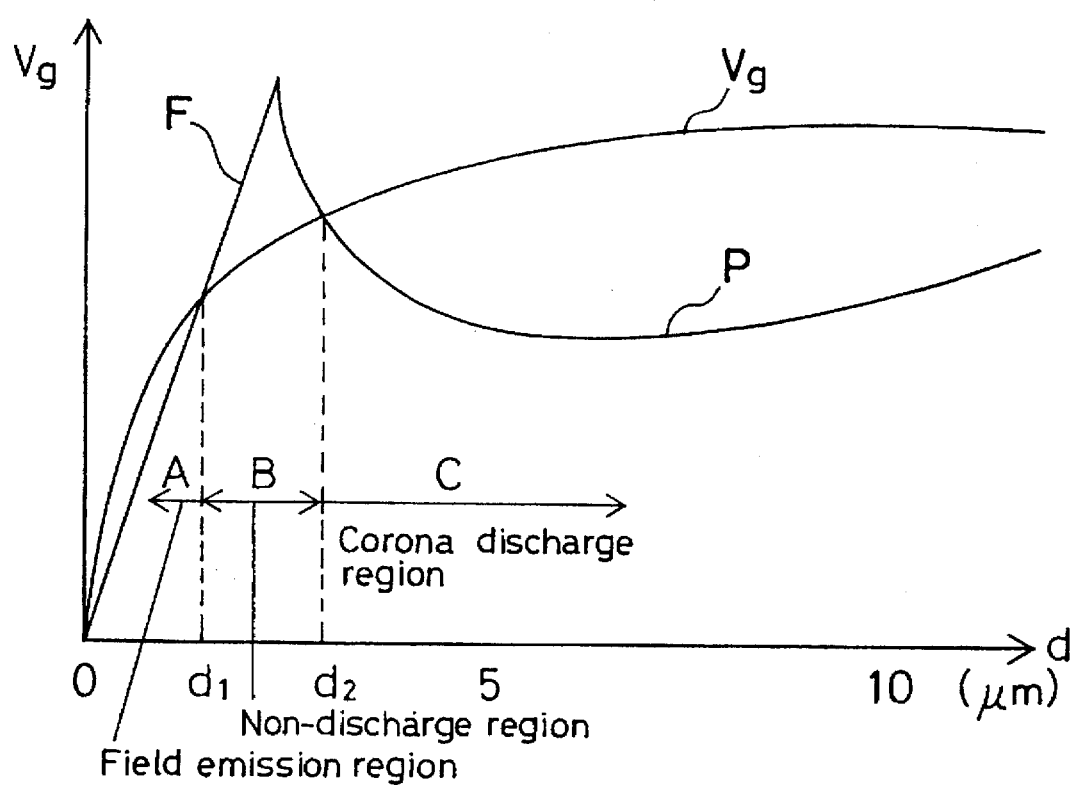
FIG. 4 is a graph showing the relationship between the Paschen discharge and the field emission.

FIG. 4 is a graph showing the relationship between the distance of the gap and the voltage across the gap.

The voltage $V_g$ (see FIG. 1(b)) across the gap between the opposing surfaces of the photosensitive member and the charge retaining medium is represented by a quadratic curve which approaches the supply voltage E as the gap d increases, as shown in FIG. 4. P denotes a Paschen discharge curve which shows corona discharge characteristics. The Paschen discharge initiating voltage reaches a minimum at a certain gap, and as the gap becomes greater than this, the electric field strength decreases and hence the Paschen discharge initiating voltage rises. In addition, as the gap narrows, the probability of particles colliding with each other decreases and it becomes difficult for the corona discharge to occur. Therefore, the discharge initiating voltage rises. If the gap further narrows to, for example, about 2 μm or less, in the atmospheric pressure, no Paschen discharge occurs any longer, and a field emission occurs instead, as shown by the straight line F. Accordingly, in regions where the gap voltage $V_g$ is greater than the straight line F or the curve P, i.e., in the region C shown in the graph, a corona discharge occurs, whereas, in the region A a field emission occurs. This fact reveals that, if the gap d between the photosensitive member and the charge retaining medium, shown in FIG. 1(a), is made smaller than $d_1$ shown in FIG. 4, a field emission occurs. In this region, substantially no collision between particles occurs, so that the electric charge, which is drawn out by the electric field, is formed on the charge retaining medium while being arranged in one direction. It is therefore possible to form a latent image of extremely high resolution.

Figure 5:
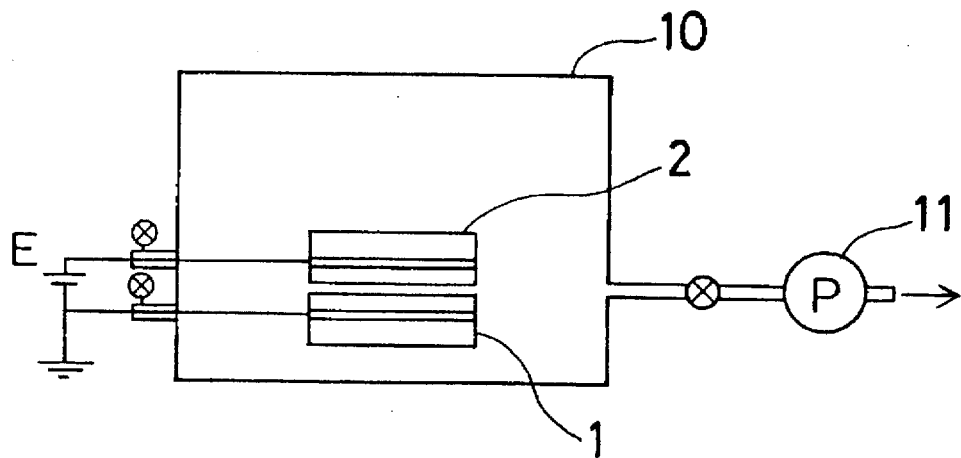
FIG. 5 shows an arrangement for causing a field emission by lowering the gas pressure.

FIG. 5 shows an example in which an electric discharge is caused by the field emission that is caused by lowering the gas pressure.

The charge retaining medium 1 and the photosensitive member 2 are accommodated in a vacuum chamber 10, and lead wires are led out from the respective electrodes of these members to the outside (without destroying the vacuum system) and connected to the power source E. With this arrangement, the air is evacuated from the chamber by the operation of a pump 11 to lower the gas pressure. This arrangement enables a field emission to occur without the need to reduce the gap to a very small value.

Figure 6:
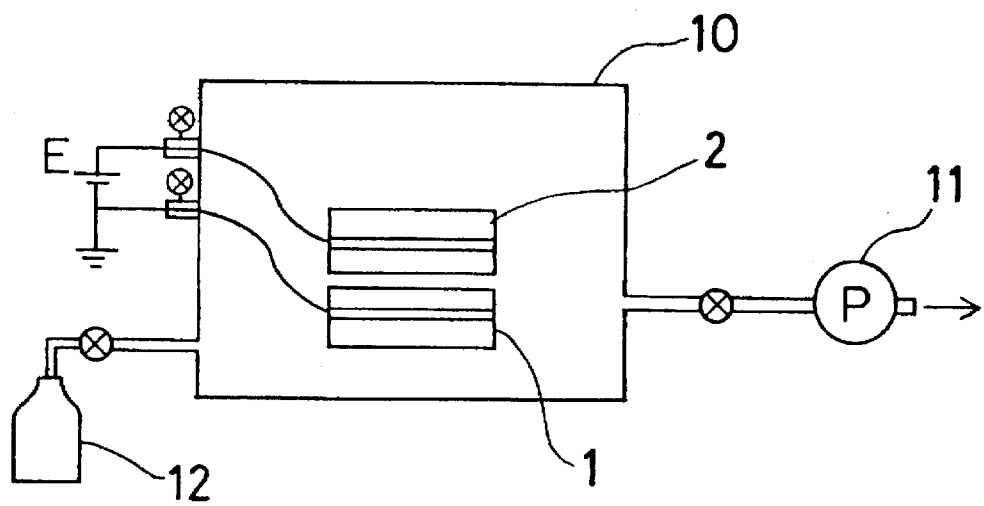
FIG. 6 shows an arrangement for causing a field emission by filling up the system with a gas.

FIG. 6 shows an example in which a field emission is caused in a space that is filled up with an inert gas. The chamber 10 is filled up with an inert gas that is supplied from a gas container 12. In addition, the charge retaining medium 1, the photosensitive member 2, the power source E and the lead wires are disposed in the same manner as in the arrangement shown in FIG. 5, and the gas pressure is reduced to a predetermined level, thereby suppressing the Paschen discharge and causing a field emission instead. By properly changing the kind of gas employed to fill up the chamber 10, it is possible to change the level of gas pressure at which the region shifts from the Paschen discharge region to the field emission region.

Thus, in the arrangements that are disclosed in FIGS. 4 to 6, an electric charge pattern is formed by utilizing field emission, and it is therefore possible to eliminate the influence of the spread of charged particles due to collision and hence possible to attain image recording of extremely high resolution.

Meantime, it is possible to record a halftone dot image simultaneously with the exposure without an electrical signal processing for the formation of dots by forming dimple patterns on the surface, conductive layer surface or the like of at least either the photosensitive member or the charge retaining medium. In addition, by providing dimple patterns on the surface of at least either the photosensitive member or the charge retaining medium and exposing with these two members being closely contacted with each other, an extremely small gap for inducing a field emission can be formed in correspondence to the dimple patterns and it is therefore possible to form a latent image in a halftone dot pattern by stable field emission.

Figure 7:
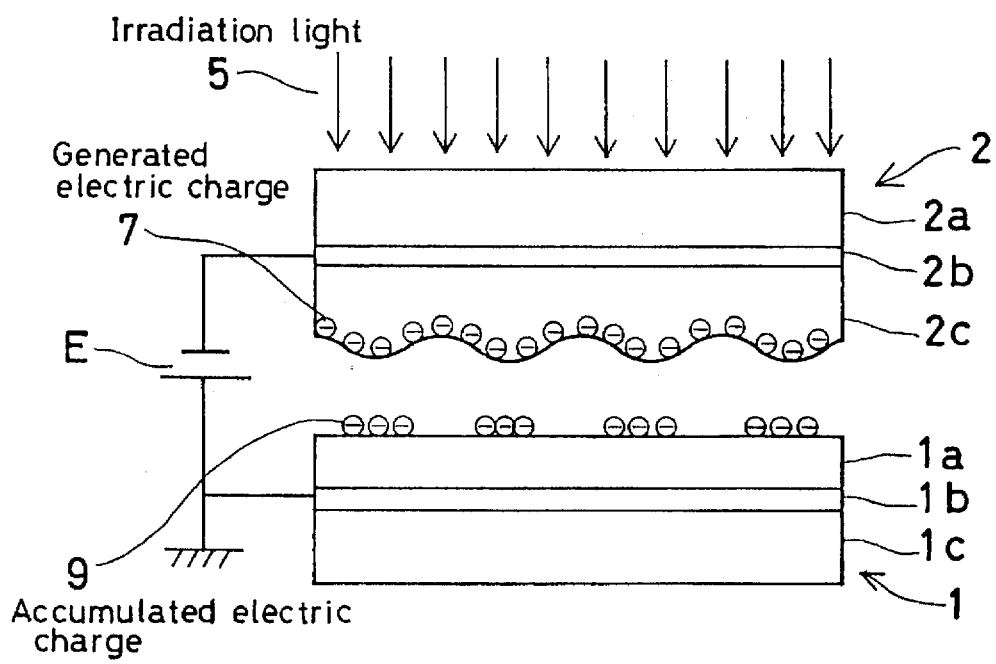
FIG. 7 shows another embodiment of the present invention.

FIG. 7 is a view which is employed to explain another embodiment of the present invention.

In FIG. 7, since the surface of the photoconductive layer 2c is formed with dimple patterns, the discharge gap between the same and the insulating layer 1a varies dimply, so that the voltage that is applied across the gap varies in accordance with the dimple patterns. As a result, a discharge pattern that is modulated by the dimple pattern is formed. Accordingly, if this dimple pattern is formed in a halftone dot pattern, a halftone dot image can be recorded without special halftone dot processing. Thus, the charge retaining medium is made to store a halftone dot image simply by exposure with a simple arrangement that the surface of the photosensitive member is merely provided with dimple patterns. There is therefore no need for a signal processing for the formation of dots, which has heretofore been needed.

If linear dots are employed so as to form tracks, the access is facilitated in such a case that coded data is recorded. If the size and distribution of dots are set at random, a grained screen for printing is obtained.

Figure 8:
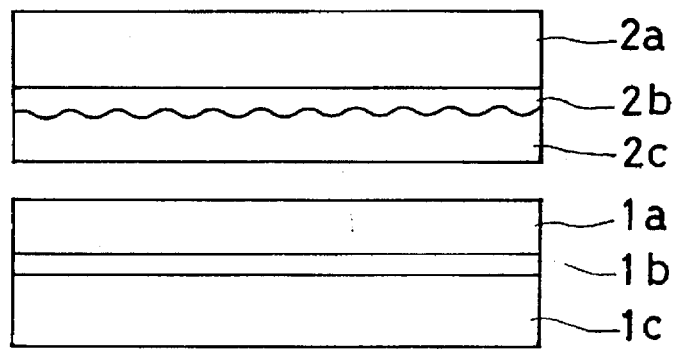
FIG. 8 shows an example in which the surface of a photosensitive member electrode is provided with dimple patterns.

FIG. 8 shows an arrangement in which dimple patterns are provided only on the surface of the photosensitive member electrode 2b. In this case also, the voltage between the photosensitive member electrode and the charge retaining medium electrode 1b varies with the location due to the dimple patterns on the surface of the photosensitive member electrode. Accordingly, when image exposure is carried out, the image to be recorded is modulated by the dimple pattern and it is therefore possible to record a halftone dot image in the same way as in the case of FIG. 7.

Figure 9:
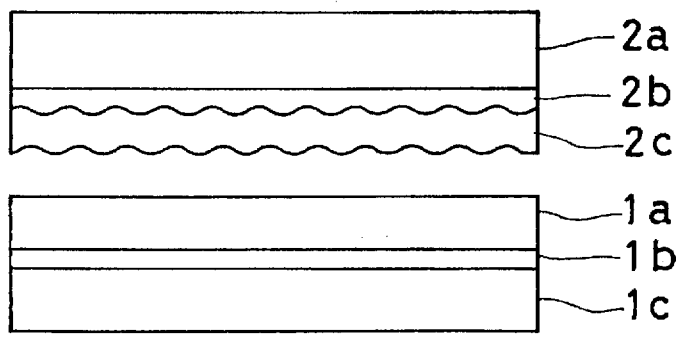
FIG. 9 shows an example in which the surfaces of a photosensitive member electrode and a photoconductive layer are provided with dimple patterns.

FIG. 9 shows an arrangement in which dimple patterns are provided on the surfaces of the photosensitive member electrode 2b and the photoconductive layer 2c.

A metallic mask that is provided with bores in a halftone dot pattern is disposed face-to-face with a substrate at a certain distance, and an electrode material is deposited from the metallic mask side by evaporation, sputtering, etc., thereby providing dimple patterns on the electrode 2b. Then, the photoconductive layer 2c is provided thereon by evaporation, sputtering, CVD, etc., thereby enabling the photoconductive layer to be also provided with dimple patterns in accordance with the dimple patterns on the electrode. Thus, it is possible to record a halftone dot image in the same way as in the case of FIG. 7.

Figure 10:
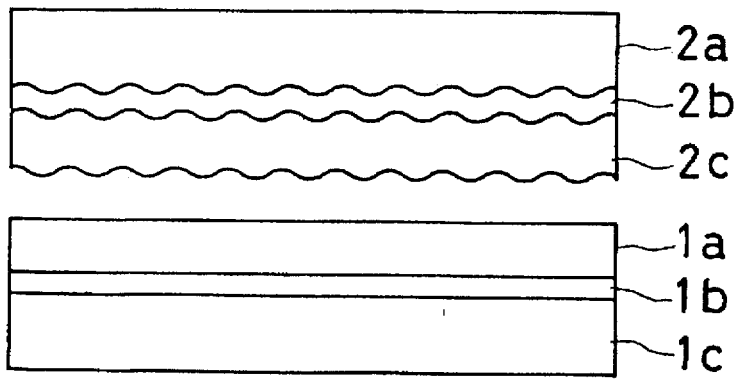
FIG. 10 shows an example in which the surfaces of a photoconductive layer substrate, a photosensitive member electrode and a photoconductive layer are provided with dimple patterns.
Figure 11:
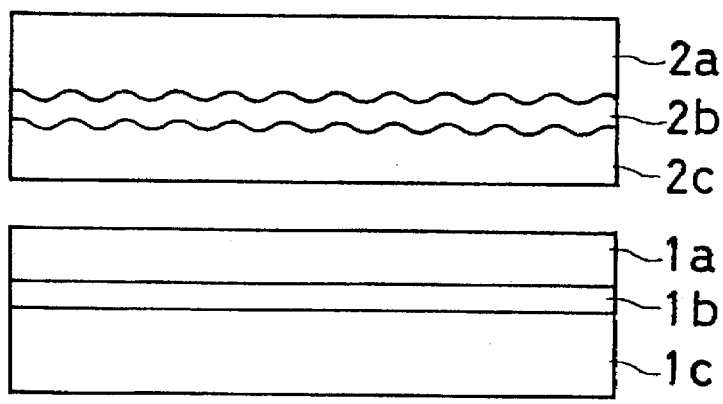
FIG. 11 shows an example in which the surfaces of a photoconductive layer substrate and a photosensitive member electrode are provided with dimple patterns.

FIG. 10 shows an arrangement in which dimple patterns are provided on the surfaces of the photoconductive layer substrate 2a, the photosensitive member electrode 2b and the photoconductive layer 2c. FIG. 11 shows an arrangement in which dimple patterns are provided on the surfaces of the photoconductive layer substrate 2a and the photosensitive member electrode 2b. In the case of FIG. 10, for example, dimple patterns are provided on the substrate 2a, e.g., glass, by etching or the like. By doing so, dimple patterns can be readily formed on the electrode and the photoconductive layer, as illustrated. In each of the arrangements shown in FIGS. 10 and 11, a halftone dot image can be recorded simply by exposure in the same way as in the case of FIG. 7.

Incidentally, the discharge gap is equivalent to the distance between the photosensitive member and the charge retaining medium. Therefore, the same advantageous effect is obtained regardless of whether dimple patterns are provided on the photosensitive member or the charge retaining medium. Accordingly, arrangements in which dimple patterns are provided on the charge retaining medium side will be explained with reference to FIGS. 12 to 16.

Figure 12:
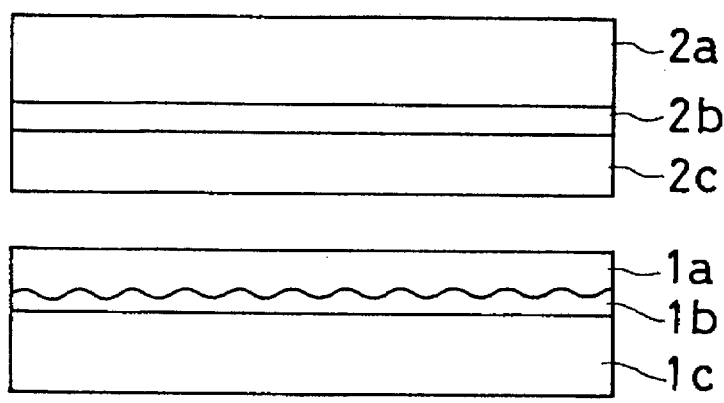
FIGS. 12 to 16 shows examples in which a charge retaining medium is provided with dimple patterns in different ways.
Figure 13:
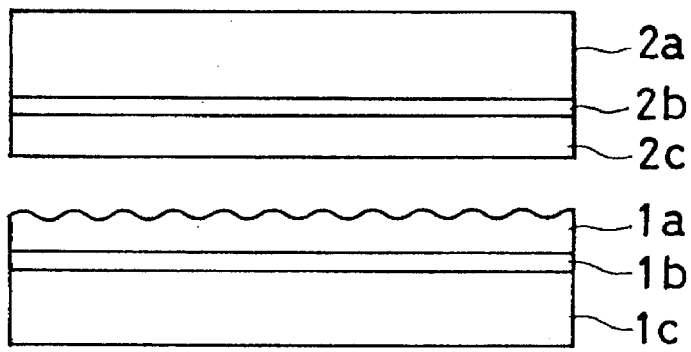
Figure 14:
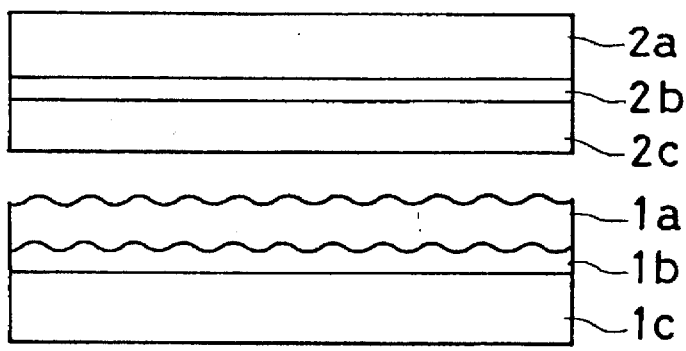
Figure 15:
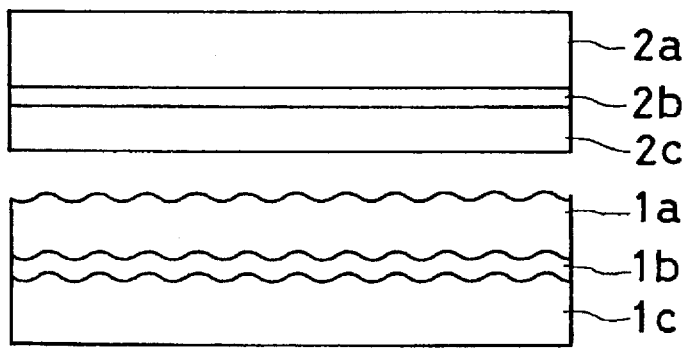
Figure 16:
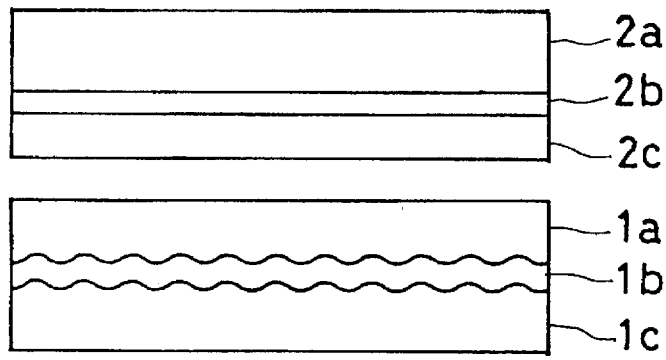

FIG. 12 shows an arrangement in which dimple patterns are provided only on the surface of the charge retaining medium electrode 1b; FIG. 13 shows an arrangement in which dimple patterns are provided only on the surface of the insulating layer 1a; FIG. 14 shows an arrangement in which dimple patterns are provided on the surface of the charge retaining medium electrode 1b and on the surface of the insulating layer 1a; FIG. 15 shows an arrangement in which dimple patterns are provided on the surface of the insulating layer substrate 1c, on the surface of the charge retaining medium electrode 1b and on the surface of the insulating layer 1a; and FIG. 16 shows an arrangement in which dimple patterns are provided on the surface of the insulating layer substrate 1c and on the surface of the charge retaining medium electrode 1b. In these cases also, a halftone dot image can be recorded simultaneously with the exposure in the same way as in the case of FIG. 7. However, in the case where dimple patterns are provided on the charge retaining medium side, if the distance between the surface of the charge retaining medium and a read head for reading the potential of the recorded latent image varies, the change in the distance produces an effect on the potential read in this way. It is therefore preferable to provide dimple patterns on the charge retaining medium electrode 1b without providing any dimple patterns on the surface of the insulating layer 1a, as shown in FIGS. 12 and 16.

Figure 17:
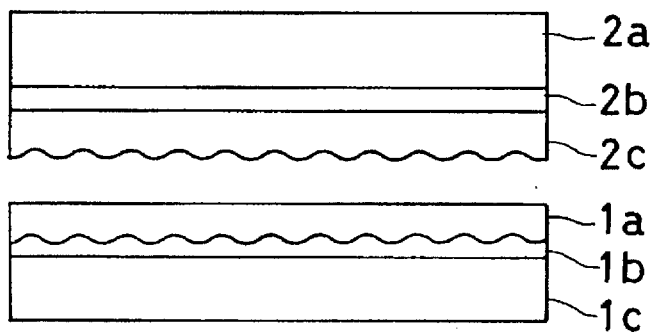
FIG. 17 shows an example in which both a photosensitive member and a charge retaining medium are provided with dimple patterns.

FIG. 17 shows an arrangement in which dimple patterns are provided on both the photosensitive member side and the charge retaining medium side. If the dimple patterns on the two members are disposed such that the convex portions of these dimple patterns face each other, and so do the concave portions, the effect of the difference between the convex and concave portions can be enhanced, so that it is possible to obtain the same effect that is obtained in the case where dimple patterns are provided only on either the photosensitive member or the charge retaining medium even if the height of these dimple patterns is smaller than in the case where dimple patterns are provided on only one side. If the dimple patterns on the two members are offset so that the convex portions of the dimple patterns on one side face the concave portions of the dimple patterns on the other side, it is possible to halve the spacing between the dimple patterns and make the dot pitch finer. In addition, if linear dimple patterns are formed on both the photosensitive member and the charge retaining medium and these two members are disposed face-to-face with each other with the angle therebetween being properly changed by appropriately rotating them relative to each other, it is possible to form halftone dots with the screen angle changed. Further, it is possible to form halftone dots by various combinations of dimple patterns, for example, a combination of concentric circle-shaped dimple patterns and radiating line-shaped dimple patterns. It is, as a matter of course, possible to provide dimple patterns on the photosensitive member electrode 2b and the insulating layer 1a in the arrangement shown in FIG. 17.

Figure 18:
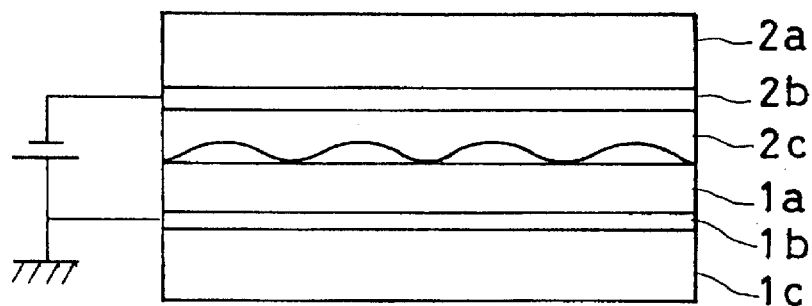
FIG. 18 shows an example of contact image exposure.

FIG. 18 shows an example in which dimple patterns are provided on the surface of either the photosensitive member or the charge retaining medium and image exposure is carried out with these two members being closely contacted with each other.

The gap between the photosensitive member and the charge retaining medium is very narrow, and if this narrow gap is not stably maintained, the amount of electric charge becomes uneven due to the unevenness of the gap. For this reason, dimple patterns are provided on the surface of either the photosensitive member or the charge retaining medium and these two members are closely contacted with each other, thereby enabling a space for an electric discharge to be ensured, as shown in FIG. 18. It is therefore possible to record a halftone dot image stably. In particular, in a field emission type arrangement such as that shown in FIG. 4 the gap between the photosensitive member and the charge retaining medium is very narrow and it is likely that the amount of electric charge will become uneven due to the unevenness of the gap unless it is stably maintained. However, by closely contacting the two members with each other, as shown in FIG. 18, it is possible to stably ensure a space for a field emission.

In the example shown in FIG. 18, the dimple pattern of the discharge gap can be realized with the machining tolerances of the dimple patterns that are formed on the surface, and it is therefore possible to achieve a high degree of accuracy and also possible to eliminate unstable factors in the operation of recording process. It should be noted that it is also possible to eliminate the unevenness of the discharge gap by providing a thin spacer on an end portion of either the photosensitive member or the charge retaining medium and bringing the portion where the spacer is provided into close contact with the other member in place of the surface that is provided with dimple patterns.

FIG. 19 shows examples of screen images comprising halftone dots. FIG. 19(a) shows a line-shaped halftone screen, which enables coded data recording on tracks. FIG. 19(b) shows a halftone screen in which the screen angle is 90°. FIG. 19(c) shows a concentric circle-shaped halftone screen. It should be noted that, if the screen angle in FIG. 19(b) is reduced, the moire pitch increases, so that, although no problem arises in the case of a relatively small pattern, when a relatively large image is formed, the color shade becomes uneven, or when a plurality of prints are made, a subtle displacement results in a color shade displacement. It is therefore necessary to select a screen angle at which the moire pitch shortens.

FIG. 20 shows another embodiment of the present invention. In the figure, reference numeral 31a denotes a photoconductive layer, 31b a conductive layer, and 31c glass.

On soda glass of 1 mm thick was formed by screen printing a checkered resist ink pattern comprising squares one side of which was 170 µm long. The end and reverse surfaces were also covered with the resist ink. Next, 10 g of ammonium fluoride, 50 ml of nitric acid and 50 ml of water were mixed together to prepare an etchant, and the glass was dipped in the etchant. Next, after rinsing, the resist was removed, and the etching depth was measured. The depth was 2 µm. ITO of about 550 Å was formed on the etched surface by sputtering to provide a conductive layer. Further, selenium of about 40 µm was formed by vacuum evaporation, thereby forming dimple patterns on the surface of the photoconductive layer, as shown in FIG. 20.

Meantime, on soda glass of 1 mm thick was formed aluminum to a thickness of 1000 Å by vacuum evaporation, and a silicone resin (TSR-144; manufactured by Toshiba Silicone K.K.) mixed with 2 wt % of CR12 as a curing catalyst was coated thereon by spin coating at 1000 rpm×30 s. Further, heating was carried out in an oven for 1 hour at 150° C. to effect drying and curing. The thickness of the silicone resin layer was about 8 µm. In this way, a charge retaining medium was prepared.

With a voltage being applied between the photosensitive member and the charge retaining medium, image exposure was carried out. As a result, an electrostatic charge pattern in the form of a halftone dot image was formed on the charge retaining medium.

Heretofore, halftone dot images have been expressed as shown in FIG. 21, in which the axis of abscissas represents the position and the axis of ordinates represents the image density. More specifically, it has been conventional practice to change the size of dots $P_1, P_2 \ldots P_N$ in accordance with the position, without changing the pitch, so that the size of the dots corresponds to the image density. According to the present invention, however, a halftone dot image can be recorded simultaneously with the exposure without the need to effect an electrical signal processing for the formation of dots, by forming dimple patterns on the surface, conductive layer, etc. of at least either the photosensitive member or the charge retaining medium. In addition, if the dimple pattern is formed into, for example, a halftone dot pattern or a random pattern, the electric charge pattern can be formed into a halftone dot pattern or a grained screen pattern. It is therefore possible to make a hard copy of a continuous tone image at a reduced cost. Further, if the dimple pattern is formed into a linear pattern, tracks can be formed, so that charge pattern information can be read efficiently.

If dimple patterns are provided on the surface of either the photosensitive member or the charge retaining medium and exposure is carried out with these two members being closely contacted with each other, a space for an electric discharge can be ensured by the dimple patterns, so that there is no unevenness of the gap and it is possible to eliminate unstable factors in the operation of recording process.

FIG. 22 is a view which is employed to explain another embodiment of the present invention, in which reference numeral 40 denotes a corona discharge electrode, and 41 a stored electric charge.

Figure 22A:
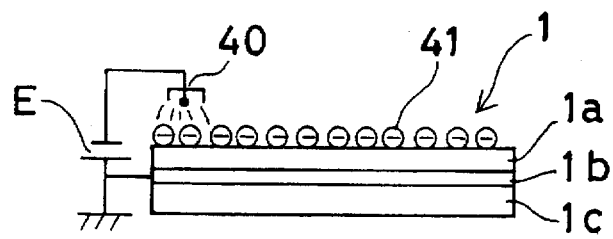
FIGS. 22 and 23 show other embodiments of the present invention.

In this embodiment, first, the charge retaining medium 1 and the corona discharge electrode 40 are disposed face-to-face with each other, as shown in FIG. 22(a), and a predetermined voltage is applied between the charge retaining medium electrode 1b and the corona discharge electrode 40 from the power source E, thereby uniformly storing on the insulating layer 1a an electric charge 41 which is opposite in polarity to an image forming charge which will be generated by image exposure, and thus effecting precharging. This is effected by moving the corona discharge electrode 40 in a state where it faces the charge retaining medium 1, as shown in FIG. 22(a).

Figure 22B:
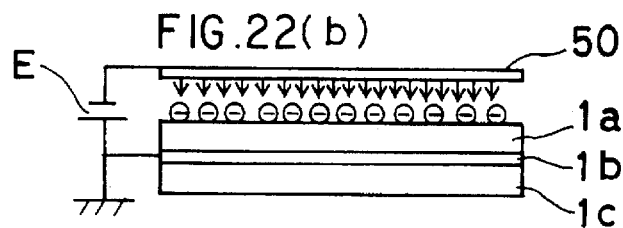

The arrangement may be such that the charge retaining medium 1 and an electrode 50 which is so shaped as to face the whole surface of the charge retaining medium 1 are disposed, as shown in FIG. 22(b), and a predetermined voltage is applied between the electrode 50 and the charge retaining medium electrode 1b, thereby uniformly storing an electric charge on the insulating layer 1a.

Figure 22C:
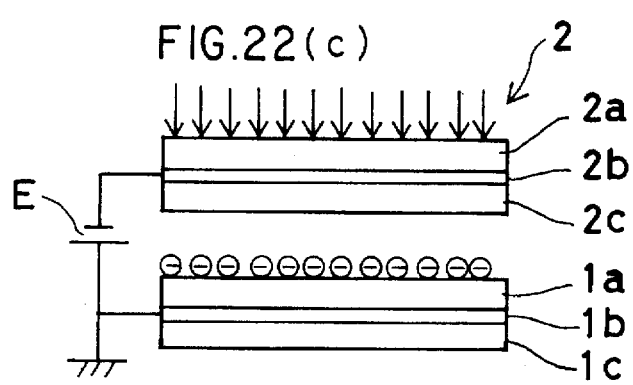

The arrangement may also be such that the photosensitive member 2 and the charge retaining medium 1 are disposed face-to-face with each other, as shown in FIG. 22(c), and with a predetermined voltage being applied between the electrodes 2b and 1b, overall exposure is effected from the photosensitive member side, thereby uniformly storing an electric charge on the insulating layer 1a.

Figure 22D:
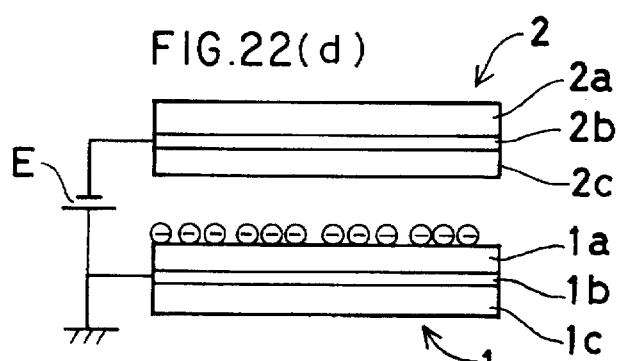

The arrangement may also be such that the photosensitive member 2 and the charge retaining medium 1 are disposed face-to-face with each other, as shown in FIG. 22(d), and a voltage which is opposite in polarity to a voltage that is applied when image exposure is carried out is applied between the electrodes 1b and 2b so that the voltage distribution to the gap exceeds the Paschen discharge initiating voltage, thereby uniformly storing an electric charge on the insulating layer of the charge retaining medium 1.

Figure 23:
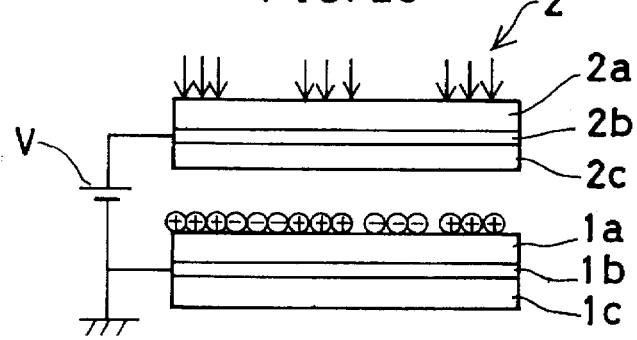

The charge retaining medium 1 uniformly charged in this way and the photosensitive member 2 are disposed face-to-face with each other, and image exposure is carried out with a predetermined voltage being applied between the two electrodes, as shown in FIG. 23. As a result, photocarriers (electrons or holes) are generated in the photoconductive layer 2c of the photosensitive member 2 at the exposed region, and an electric charge which is opposite in polarity to the charge retaining medium electrode moves through the photoconductive layer 2c toward the surface thereof. If, as a result, the voltage distribution to the air gap exceeds the Paschen discharge initiating voltage, an electric discharge occurs, and the carriers combine with ions dissociated in the air gap. In consequence, an electric charge in the air gap which is opposite in polarity to the combined ions is attracted by the electric field in the air gap and stored on the insulating layer 1a, thus image recording being effected.

In such image recording, when irradiated with light, the photosensitive member 2 serves as a conductive semiconductor that passes photocurrent, whereas, when no light is applied, it serves as a semiconductor that is close to an insulator, which is its original form. In addition, when a voltage that exceeds a voltage that is determined by the Paschen discharge characteristics is applied to the air layer, the discharge gap can be regarded as a conductor. The charge retaining medium 1 may be considered to be an insulator at all times.

Figure 24A:
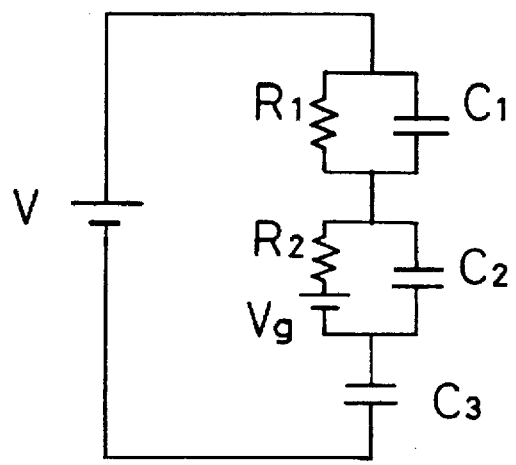
FIG. 24 shows equivalent circuits.

Accordingly, the system that is shown in FIG. 23 may be considered to be an equivalent circuit such as that shown in FIG. 24(a), as a simple model. In FIG. 24(a), V denotes a supply voltage that is applied between the photosensitive member and the charge retaining medium, $C_1$, $R_1$ the resistance and capacitance of the photosensitive member, $C_2$, $R_2$ the resistance and capacitance of the air layer, $V_g$ the Paschen discharge initiating voltage, and $C_3$ the capacitance of the charge retaining medium.

Figure 24B:
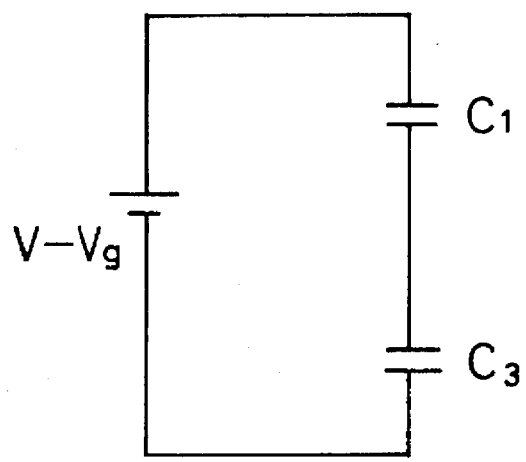

When the air gap voltage exceeds the discharge initiating voltage $V_g$, the gap voltage is saturated at $V_g$. When no light is applied and the gap voltage is in excess of the discharge initiating voltage, the equivalent circuit may be considered to be such that the supply voltage decreases by $V_g$ and the photosensitive member and charge retaining medium are connected in series through the capacitances $C_1$ and $C_3$, as shown in FIG. 24(b). When light is applied from the photosensitive member side and consequently the photosensitive member becomes a conductor, it may be considered that the equivalent circuit is such as that shown in FIG. 24(c).

Assuming that the surface of the charge retaining medium is uniformly subjected to precharging and the potential is V', the amount of electric charge that is stored on the charge retaining medium 1 is given by $$Q = C_3 V' \tag{1}$$

Assuming that voltages that are distributed to the capacitances $C_1$ and $C_3$ when the gap voltage exceeds the discharge initiating voltage $V_g$ are represented by $V_1$ and $V_3$, respectively, the following simultaneous equations are valid:

$$V_1 + V_3 = V - V_g$$

$$C_1V_1 + C_3V_3 = C_3V'$$

The equations are solved as follows:

$$V_1 = C_3(V - V_g)/(C_1 + C_3) - C_3V'/(C_1 + C_3) \quad (2)$$

$$V_3 = C_1(V - V_g)/(C_1 + C_3) + C_3V'/(C_1 + C_3) \quad (3)$$

The first term on the right side of the equation (2) is a voltage that is applied to the photosensitive member in a dark state, and the second term is a voltage that is generated in the photosensitive member by the precharging. In the equation (3), the first term on the right side is a background potential at the unexposed region, and the second term is a voltage that is generated by the precharging.

Figure 24C:
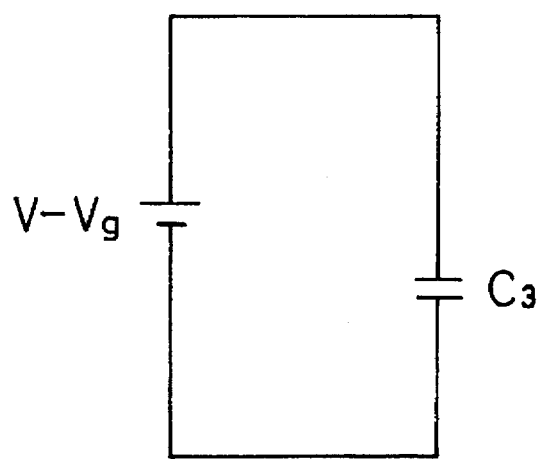

When the photosensitive member becomes a conductor as a result of image exposure, that is, the equivalent circuit is such as that shown in FIG. 24(c), the potential on the charge retaining medium is $V-V_g$ irrespective of whether precharging has been effected or not. Accordingly, the difference between the potentials at the exposed and unexposed regions on the charge retaining medium, that is, the contrast potential, is given by $$V - V_g - V_3 = C_1(V - V_g)/(C_1 + C_3) - C_3V'/(C_1 + C_3) \quad (4)$$

It will be understood from the equation (4) that, if a negative potential is given to V', the contrast potential increases. This will also be understood from the fact that in the equation (3) the background potential at the unexposed region is canceled by the precharging and in the equation (2) the voltage that is applied to the photosensitive member is increased by the precharging. Since the voltage that is applied to the photosensitive member increases in this way, if a photosensitive material the sensitivity of which depends on the electric field strength, for example, selenium, is employed, it is possible to increase the quantum efficiency and raise the sensitivity.

EXAMPLE 1

An aluminum electrode was provided on a glass substrate, and a methylphenyl silicone resin (TSR-144; manufactured by Toshiba Silicone) mixed with 1 wt % of a curing agent (CR-15) was coated on the electrode by spinner coating (1000 rpm×30 s) and then dried for 1 hr at 150° C. to form an insulating layer with a film thickness of 9 μm, thereby preparing a charge retaining medium. The charge retaining medium was charged by a corona voltage of −6 KV until a surface potential of −600 V was reached. As a photosensitive member, an photosensitive member (a-Se as a photoconductor layer; thickness: 10 μm) that was prepared on nesa glass by vacuum evaporation (resistive heating; under $10^{-5}$ Torr) was employed. With an air layer of 9 μm, a voltage of +750 V was applied between the photosensitive member and the charge retaining medium for about 1 second, and in this state, exposure (tungsten lamp: 3100° K., 30 lx) was carried out. As a result, the potential at the light region was 280 V, while the potential at the dark region was 110 V; therefore, the contrast potential was 170 V.

In comparison to the exposure under the voltage application, which was carried out under the above-described conditions except no precharging, although there was no change in the potential at the light region, the potential at the dark region was 90 V lower than in the case of the comparative example, which means that the contrast voltage increased by 90 V.

EXAMPLE 2

An aluminum electrode plate was disposed face-to-face with the charge retaining medium with an air layer of 9 μm interposed therebetween, and a voltage of 1 KV was applied therebetween (for about 1 second), thereby charging the surface of the charge retaining medium. As a result, the surface potential was −600 V. Then, exposure under the voltage application was carried out in the same way as in [Example 1]. As a result, the same advantageous effects were obtained.

EXAMPLE 3

With the photosensitive member and the charge retaining medium being disposed in the same way as in the exposure under the voltage application in [Example 1], light (50 μW/cm²) was applied to the whole surface of the photosensitive member with a wavelength of 500 mm at which photocarriers were generated, and in this state, a voltage of −750 V which was opposite in polarity to a voltage applied during the exposure under the voltage was applied for about 1 second, so that a potential of −310 V was placed on the charge retaining medium. In this state, the application of the voltage was suspended and, with uniform light illumination, the photosensitive member electrode was grounded to allow the electric charge on the photosensitive member surface to escape. Thereafter, exposure under the voltage application was carried out. As a result, the potential at the dark region was 140 V. Thus, the contrast potential increased by 60 V.

EXAMPLE 4

With the photosensitive member and the charge retaining medium being disposed in the same way as in [Example 1], a voltage of −850 V which was opposite in polarity to a voltage applied during image exposure was applied (for 1 second). As a result, a dark discharge occurred at the air gap, and an electric charge of −250 V was uniformly formed on the charge retaining medium.

After the supply of the voltage was cut off, with the circuit being opened, uniform light (tungsten lamp: 3100° K., 10 lux×1 second) was applied from the reverse side of the photosensitive member to erase the electric charge stored on the surface of the photosensitive member. Thereafter, exposure under the voltage application was carried out in the same way as in Example 1 with the normal polarity (i.e., with the photosensitive member electrode being set positive). As a result, the dark potential was 160 V. Thus, the contrast potential increased by 40 V.

Thus, by uniformly forming an electric charge which is opposite in polarity to the image forming charge in advance of the image exposure, the background potential at the unexposed region can be reduced, so that the contrast potential can be increased. In addition, it is possible to increase the initial voltage distribution to the photosensitive member. As a result, it is possible to improve the photosensitivity and hence possible to effect image recording of high resolution.

As has been described above, by changing either the gap distance or the gas pressure between the photosensitive member and the charge retaining medium, a shutter function can be realized in a state where a DC voltage is being applied. Thus, it is possible to eliminate the need for precise control for generating a high-voltage pulse and for an optical shutter and hence possible to reduce the system cost. It is also possible to form a charge pattern by utilizing a field emission to thereby effect image recording of extremely high resolution. If dimple patterns are formed on the surface, conductive layer surface or the like of at least either the photosensitive member or the charge retaining medium, it is possible to record a halftone dot image simultaneously with the exposure. In addition, since an extremely small discharge gap can be formed with the machining tolerances of the dimple patterns, it is possible to eliminate unstable factors in the operation of the recording process. Further, by uniformly forming an electric charge which is opposite in polarity to the image forming charge in advance of the image exposure, it is possible to increase the contrast potential and also improve the exposure sensitivity.

What is claimed is:

1. An image recording method in which a photosensitive member consisting of a photoconductive layer which is formed on a substrate with a conductive layer interposed therebetween is disposed face-to-face with a charge retaining medium consisting of an insulating layer which is formed on a substrate with a conductive layer interposed therebetween, and image exposure is carried out from said photosensitive member side with a voltage being applied across an air gap between the two conductive layers of said photosensitive member and said charge retaining medium, thereby inducing a field emission and a resulting electric discharge in said air gap between said photosensitive member and said charge retaining medium, and thus storing an electric charge in the form of an image on the surface of said charge retaining medium, comprising the steps of:

placing the charge retaining member and the photosensitive member in a vacuum chamber in which gas pressure is controlled by a pump; and controlling the pump to change the gas pressure between said photosensitive member and said charge retaining medium, thereby switching field emission and the resulting electric discharge ON/OFF in said air gap and effecting image recording without changing said air gap.

2. An image recording method in which a photosensitive member consisting of a photoconductive layer which is formed on a substrate with a conductive layer interposed therebetween is disposed face-to-face with a charge retaining medium consisting of an insulating layer which is formed on a substrate with a conductive layer interposed therebetween, and image exposure is carried out with a voltage being applied across an air gap between the two conductive layers of said photosensitive member and said charge retaining medium, thereby inducing a field emission and a resulting electric discharge in said air gap between said photosensitive member and said charge retaining medium, and thus storing an electric charge in the form of an image on the surface of said charge retaining medium, wherein dimple patterns are formed on the surfaces and/or the conductive layer surfaces of said photosensitive member and said charge retaining medium, comprising the steps of:

placing the charge retaining member and the photosensitive member in a vacuum chamber in which gas pressure is controlled by a pump; and inducing a field emission and the resulting electric discharge in said air gap by controlling the pump to lower the gas pressure in said air gap without changing said air gap.

* * * * *